(12) United States Patent
Yuan et al.

(10) Patent No.: US 12,154,652 B2
(45) Date of Patent: *Nov. 26, 2024

(54) DYNAMIC RANDOM ACCESS MEMORY APPLIED TO AN EMBEDDED DISPLAY PORT

(71) Applicant: Etron Technology, Inc., Hsinchu (TW)

(72) Inventors: Der-Min Yuan, New Taipei (TW); Yen-An Chang, Miaoli County (TW); Wei-Ming Huang, Hsinchu County (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/540,888

(22) Filed: Dec. 15, 2023

(65) Prior Publication Data
US 2024/0112707 A1 Apr. 4, 2024

Related U.S. Application Data

(63) Continuation of application No. 17/213,133, filed on Mar. 25, 2021, now Pat. No. 11,894,098, which is a
(Continued)

(51) Int. Cl.
*G11C 7/10* (2006.01)
*G11C 11/4074* (2006.01)
(Continued)

(52) U.S. Cl.
CPC ........ *G11C 7/1075* (2013.01); *G11C 11/4074* (2013.01); *G06F 3/061* (2013.01);
(Continued)

(58) Field of Classification Search
CPC ............... G06F 12/0238; G06F 12/063; G06F 12/0692; G06F 12/0866; G06F 12/0882;
(Continued)

(56) References Cited

U.S. PATENT DOCUMENTS 5,928,336 A 7/1999 Takeuchi
6,097,070 A 8/2000 Mandelman
(Continued)

FOREIGN PATENT DOCUMENTS

CN 102187323 A 9/2011
TW 201123198 7/2011

OTHER PUBLICATIONS

Iyer, S.S.; IBM Corp., East Fishkill, NY, USA; Kalter, H.L., "Embedded DRAM technology: opportunities and challenges", Spectrum, IEEE ( vol. 36, Issue: 4), Apr. 1999, IEEE, pp. 56-64.

*Primary Examiner* — Hashem Farrokh
(74) *Attorney, Agent, or Firm* — Winston Hsu

(57) ABSTRACT

A dynamic random access memory applied to an embedded display port includes a memory core unit, a peripheral circuit unit, and an input/output unit. The memory core unit is used for operating in a first predetermined voltage. The peripheral circuit unit is electrically connected to the memory core unit for operating in a second predetermined voltage, where the second predetermined voltage is lower than 1.1V. The input/output unit is electrically connected to the memory core unit and the peripheral circuit unit for operating in a third predetermined voltage, where the third predetermined voltage is lower than 1.1V.

6 Claims, 1 Drawing Sheet

Related U.S. Application Data continuation of application No. 16/151,347, filed on Oct. 4, 2018, now Pat. No. 10,998,017, which is a continuation of application No. 13/922,242, filed on Jun. 19, 2013, now abandoned.

(60) Provisional application No. 61/768,406, filed on Feb. 23, 2013, provisional application No. 61/672,287, filed on Jul. 17, 2012.

(51) Int. Cl.

| | | |
|---|---|---|
| G06F 3/06 | (2006.01) | |
| G06F 12/02 | (2006.01) | |
| G06F 12/06 | (2006.01) | |
| G06F 12/0866 | (2016.01) | |
| G06F 12/0882 | (2016.01) | |
| G06F 13/42 | (2006.01) | |
| G11C 11/406 | (2006.01) | |

(52) U.S. Cl.
CPC .......... *G06F 3/0653* (2013.01); *G06F 3/0656* (2013.01); *G06F 12/0238* (2013.01); *G06F 12/063* (2013.01); *G06F 12/0692* (2013.01); *G06F 12/0866* (2013.01); *G06F 12/0882* (2013.01); *G06F 13/4221* (2013.01); *G06F 13/4278* (2013.01); *G11C 11/40615* (2013.01); *Y02D 10/00* (2018.01)

(58) Field of Classification Search
CPC .. G06F 13/4221; G06F 13/4278; G06F 3/061; G06F 3/0653; G06F 3/0656; G11C 11/40615; G11C 11/4074; G11C 7/1075; Y02D 10/00
USPC .......................................................... 711/154
See application file for complete search history.

(56) References Cited

U.S. PATENT DOCUMENTS

| | | |
|---|---|---|
| 6,363,014 B1 | 3/2002 | Fastow |
| 6,551,896 B2 | 4/2003 | Hosoda |
| 6,570,787 B1 | 5/2003 | Wang |
| 7,295,036 B1 | 11/2007 | Zaveri |
| 7,594,129 B2 | 9/2009 | Otani |
| 7,692,979 B2 | 4/2010 | Fuji |
| 7,894,294 B2 | 2/2011 | Pyeon |
| 2003/0031043 A1 | 2/2003 | Pochmuller |
| 2005/0010746 A1 | 1/2005 | Chen |
| 2005/0133852 A1* | 6/2005 | Shau .................... G11C 11/404 257/E21.639 |
| 2006/0047985 A1 | 3/2006 | Otani |
| 2006/0120138 A1 | 6/2006 | Liaw |
| 2006/0140004 A1 | 6/2006 | Shukuri |
| 2006/0192282 A1 | 8/2006 | Suwa |
| 2006/0259679 A1 | 11/2006 | Schumann |
| 2008/0117700 A1 | 5/2008 | Nakamura |
| 2009/0067217 A1 | 3/2009 | Sunwoo |
| 2009/0122620 A1* | 5/2009 | Mohammad .......... G11C 11/413 365/189.11 |
| 2010/0005439 A1 | 1/2010 | Shikata |
| 2010/0008172 A1 | 1/2010 | Yano |
| 2010/0074043 A1 | 3/2010 | Kang |
| 2010/0095137 A1 | 4/2010 | Bieswanger |
| 2010/0290300 A1* | 11/2010 | Takahashi ........... G11C 11/4094 365/207 |
| 2011/0069562 A1 | 3/2011 | Conte |
| 2011/0252253 A1 | 10/2011 | Rui |
| 2011/0292448 A1 | 12/2011 | Ohashi |
| 2012/0182076 A1 | 7/2012 | Kim |
| 2013/0046941 A1 | 2/2013 | Ma |
| 2013/0132660 A1 | 5/2013 | Li |
| 2013/0135955 A1 | 5/2013 | McCombs |

* cited by examiner

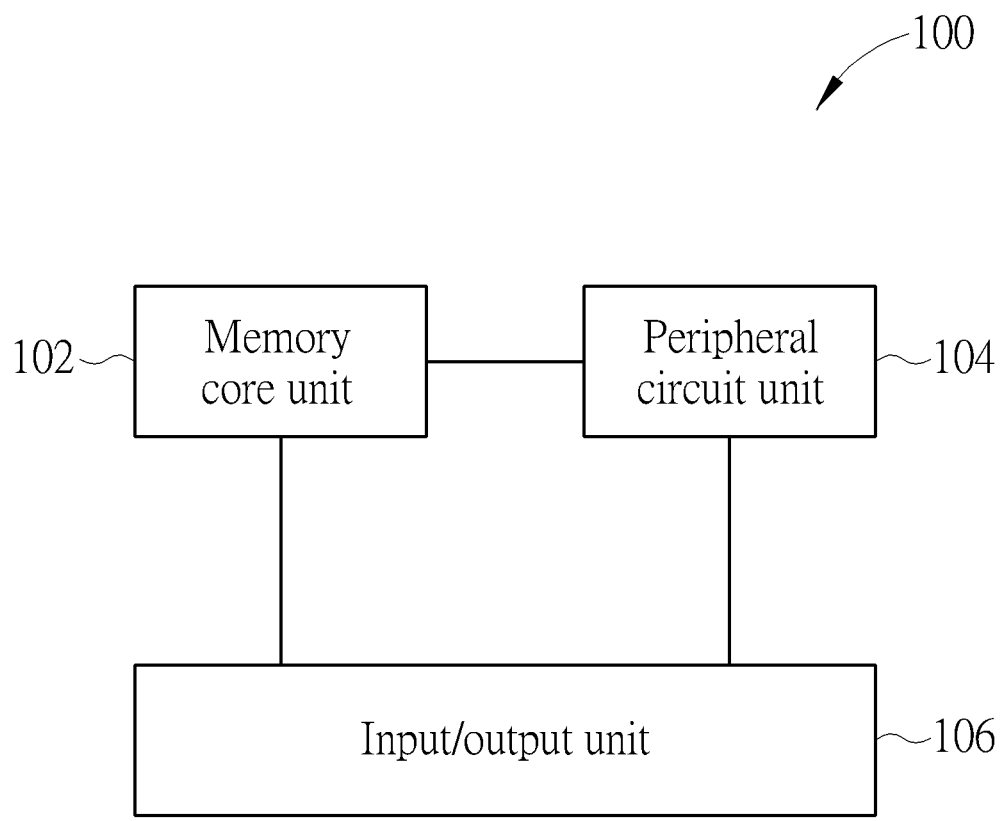

DYNAMIC RANDOM ACCESS MEMORY APPLIED TO AN EMBEDDED DISPLAY PORT

CROSS REFERENCE TO RELATED APPLICATIONS

This application is a continuation application of U.S. application Ser. No. 17/213,133, filed on Mar. 25, 2021, which is a continuation application of U.S. application Ser. No. 16/151,347, filed on Oct. 4, 2018, which is a continuation application of U.S. application Ser. No. 13/922,242, filed on Jun. 19, 2013, which claims the benefit of U.S. Provisional Application No. 61/672,287, filed on Jul. 17, 2012, and claims the benefit of U.S. Provisional Application No. 61/768,406, filed on Feb. 23, 2013. The contents of these applications are incorporated herein by reference.

BACKGROUND OF THE INVENTION

1. Field of the Invention

The present invention relates to a dynamic random access memory, and particularly to a dynamic random access memory applied to an embedded display port.

2. Description of the Prior Art

An embedded display port (eDP) published by the Video Electronics Standards Association (VESA) is used for acting as a standard display panel interface to connect external devices. For example, the embedded display port can act as an interface between a video card and a notebook panel. In addition, the embedded display port version 1.3 published by the Video Electronics Standards Association adds a panel self refresh (PSR) function, where the panel self refresh function can make a graphic processing unit (GPU) turn off connection between the graphic processing unit and a liquid crystal panel when a frame displayed on the liquid crystal panel is frozen. Thus, power consumption of the graphic processing unit can be significantly reduced and battery endurance ability can be extended.

In addition, a timing controller supporting the panel self refresh function of the liquid crystal display needs to include a frame buffer (e.g. a dynamic random access memory). When the graphic processing unit turns off the connection between the graphic processing unit and the liquid crystal panel, the frame buffer needs to store a last frame before the graphic processing unit turns off the connection between the graphic processing unit and the liquid crystal panel. Therefore, when no data transmission exists between the graphic processing unit and the liquid crystal panel, the timing controller can directly output the last frame stored in the frame buffer.

Although the panel self refresh function can make power consumption of the graphic processing unit be significantly reduced, power consumption of the timing controller is increased due to operation of the frame buffer. Therefore, how to design the frame buffer to reduce the power consumption of the timing controller becomes an important issue of memory manufacturers.

SUMMARY OF THE INVENTION

An embodiment provides a dynamic random access memory applied to an embedded display port. The dynamic random access memory includes a memory core unit and a peripheral circuit unit. The memory core unit is used for operating in a first predetermined voltage. The peripheral circuit unit is electrically connected to the memory core unit for operating in a second predetermined voltage, where the second predetermined voltage is lower than 1.1V.

Another embodiment provides a dynamic random access memory applied to an embedded display port. The dynamic random access memory includes a memory core unit, a peripheral circuit unit, and an input/output unit. The memory core unit is used for operating in a first predetermined voltage. The peripheral circuit unit is electrically connected to the memory core unit for operating in a second predetermined voltage, where the second predetermined voltage is lower than 1.1V. The input/output unit is electrically connected to the peripheral circuit unit and the memory core unit for operating in a third predetermined voltage, where the third predetermined voltage is lower than 1.1V.

The present invention provides a dynamic random access memory applied to an embedded display port. The dynamic random access memory makes a memory core unit, a peripheral circuit unit, and an input/output unit thereof operate in lower voltages. Compared to the prior art, power consumption of the dynamic random access memory of the present invention is much lower than power consumption of a dynamic random access memory operating in operation voltages specified by the Joint Electron Device Engineering Council. Thus, when the dynamic random access memory of the present invention is applied to an embedded display port, the present invention can make system power consumption (e.g. power consumption of a graphic processing unit) be significantly reduced, not make power consumption of a timing controller be increased due to operation of a frame buffer, and extend battery endurance ability of a portable device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The FIGURE is a diagram illustrating a dynamic random access memory applied to embedded display port according to an embodiment.

DETAILED DESCRIPTION

Please refer to the FIGURE. The FIGURE is a diagram illustrating a dynamic random access memory 100 applied to an embedded display port according to an embodiment, where the dynamic random access memory 100 acts as a frame buffer of a timing controller of a liquid crystal display, and the dynamic random access memory 100 is compatible with a single data rate (SDR) specification, a double data rate (DDR I) specification, a double data rate two (DDR II) specification, or a double data rate three (DDR III) specification. As shown in the FIGURE, the dynamic random access memory 100 includes a memory core unit 102, a peripheral circuit unit 104, and an input/output unit 106, where the peripheral circuit unit 104 is electrically connected to the memory core unit 102, and the input/output unit 106 is electrically connected to the peripheral circuit unit 104 and the memory core unit 102. Please refer to Table I. Table I illustrates operation voltages (specified by the Joint Electron Device Engineering Council (JEDEC)) of a dynamic random access memory operating in the DDR I specification, a low power DDR I specification, the DDR II specification, and a low power DDR II specification.

TABLE I

| | memory core unit 102 | peripheral circuit unit 104 | input/output unit 106 |
|---|---|---|---|
| DDR I | 3.3 V ± 0.3 V or 2.5 V ± 0.2 V | 3.3 V ± 0.3 V or 2.5 V ± 0.2 V | 3.3 V ± 0.3 V or 2.5 V ± 0.2 V |
| Low Power DDR I | 1.8 V ± 0.1 V | 1.8 V ± 0.1 V | 1.8 V ± 0.1 V |
| DDR II | 1.8 V ± 0.1 V | 1.8 V ± 0.1 V | 1.8 V ± 0.1 V |
| Low Power DDR II | 1.7 V~1.95 V | 1.14 V~1.30 V | 1.14 V~1.30 V |

If the dynamic random access memory 100 is designed to have low power consumption to reduce power consumption of the timing controller, the dynamic random access memory 100 needs to have low operation power consumption (e.g. power consumption for the dynamic random access memory 100 outputting storage frames to the timing controller) and low standby power consumption. But, the operation voltages specified by the Joint Electron Device Engineering Council (as shown in Table I) can not satisfy requirements (that is, the low operation power consumption and the low standby power consumption) of the embedded display port (eDP) version 1.3.

Please refer to Table II. Table II illustrates operation voltage ranges of the dynamic random access memory 100 operating in the DDR I specification, the low power DDR I specification, the DDR II specification, and the low power DDR II specification according to an embodiment.

TABLE II

| | memory core unit 102 | peripheral circuit unit 104 | input/output unit 106 |
|---|---|---|---|
| operation voltage ranges | <1.1 V | <1.1 V | <1.1 V |

As shown in Table II, operation voltages of the memory core unit 102 in the DDR I specification, the low power DDR I specification, the DDR II specification, and the low power DDR II specification are a first predetermined voltage, where the first predetermined voltage is lower than 1.1V; operation voltages of the peripheral circuit unit 104 in the DDR I specification, the low power DDR I specification, the DDR II specification, and the low power DDR II specification are a second predetermined voltage, where the second predetermined voltage is lower than 1.1V; and operation voltages of the input/output unit 106 in the DDR I specification, the low power DDR I specification, the DDR II specification, and the low power DDR II specification are a third predetermined voltage, where the third predetermined voltage is lower than 1.1V.

As shown in Table II, because the operation voltages of the memory core unit 102 in the DDR I specification, the low power DDR I specification, the DDR II specification, and the low power DDR II specification are the first predetermined voltage, the dynamic random access memory 100 has lower memory core power consumption; because the operation voltages of the peripheral circuit unit 104 in the DDR I specification, the low power DDR I specification, the DDR II specification, and the low power DDR II specification are the second predetermined voltage, the dynamic random access memory 100 has lower access power consumption; and the operation voltages of the input/output unit 106 in the DDR I specification, the low power DDR I specification, the DDR II specification, and the low power DDR II specification are the third predetermined voltage, the dynamic random access memory 100 has lower input/output power consumption. In addition, the input/output unit 106 is compatible with an interface provided by the prior art, so power consumption of the dynamic random access memory 100 is much lower than power consumption of the dynamic random access memory operating in the operation voltages specified by the Joint Electron Device Engineering Council.

Please refer to Table III. Table III illustrates operation voltage ranges of the dynamic random access memory 100 operating in the DDR I specification, the low power DDR I specification, the DDR II specification, and the low power DDR II specification according to another embodiment.

TABLE III

| | memory core unit 102 | peripheral circuit unit 104 | input/output unit 106 |
|---|---|---|---|
| operation voltage ranges | 1.8 V ± 0.1 V | <1.1 V | <1.1 V |

As shown in Table III, operation voltages of the memory core unit 102 in the DDR I specification, the low power DDR I specification, the DDR II specification, and the low power DDR II specification are a first predetermined voltage, where the first predetermined voltage is equal to 1.8V±0.1V; operation voltages of the peripheral circuit unit 104 in the DDR I specification, the low power DDR I specification, the DDR II specification, and the low power DDR II specification are a second predetermined voltage, where the second predetermined voltage is lower than 1.1V; and operation voltages of the input/output unit 106 in the DDR I specification, the low power DDR I specification, the DDR II specification, and the low power DDR II specification are a third predetermined voltage, where the third predetermined voltage is lower than 1.1V.

As shown in Table III, because the operation voltages of the memory core unit 102 in the DDR I specification, the low power DDR I specification, the DDR II specification, and the low power DDR II specification are the first predetermined voltage, the dynamic random access memory 100 has higher charge pump efficiency; because the operation voltages of the peripheral circuit unit 104 in the DDR I specification, the low power DDR I specification, the DDR II specification, and the low power DDR II specification are the second predetermined voltage, the dynamic random access memory 100 has lower access power consumption; and the operation voltages of the input/output unit 106 in the DDR I specification, the low power DDR I specification, the DDR II specification, and the low power DDR II specification are the third predetermined voltage, the dynamic random access memory 100 has lower input/output power consumption. In addition, the input/output unit 106 is also compatible with an interface provided by the prior art, so power consumption of the dynamic random access memory 100 is much lower than power consumption of the dynamic random access memory operating in the operation voltages specified by the Joint Electron Device Engineering Council.

To sum up, the dynamic random access memory applied to an embedded display port makes the memory core unit, the peripheral circuit unit, and the input/output unit operate in lower voltages. Compared to the prior art, power consumption of the dynamic random access memory of the present invention is much lower than power consumption of a dynamic random access memory operating in the operation voltages specified by the Joint Electron Device Engineering Council. Thus, when the dynamic random access memory of the present invention is applied to an embedded display port, the present invention can make system power consumption (e.g. power consumption of a graphic processing unit) be significantly reduced, not make power consumption of the timing controller be increased due to operation of the frame buffer, and extend battery endurance ability of a portable device.

Although the present invention has been illustrated and described with reference to the embodiments, it is to be understood that the invention is not to be limited to the disclosed embodiments, but on the contrary, is intended to cover various modifications and equivalent arrangements included within the spirit and scope of the appended claims.

What is claimed is:

1. A dynamic random access memory (DRAM), comprising:
   a DRAM core cell comprised in the DRAM, wherein the DRAM core cell is supplied with a first voltage within a first voltage range to make the DRAM core cell operate at the first voltage, and the DRAM core cell is a volatile memory cell, wherein the first voltage is lower than 1.1V; and
   an input/output circuit comprised in the DRAM, wherein the input/output circuit is electrically connected to the DRAM core cell, and the input/output circuit is supplied with a third voltage to make the input/output circuit operate at the third voltage, wherein the third voltage is lower than 1.1V, and
   wherein the DRAM core cell and the input/output circuit are formed on a single chip, the input/output circuit is external to the DRAM core cell, and the first voltage is different from the third voltage.

2. A dynamic random access memory (DRAM), comprising:
   a DRAM core cell comprised in the DRAM, wherein the DRAM core cell is supplied with a first voltage within a first voltage range to make the DRAM core cell operate at the first voltage, and the DRAM core cell is a volatile memory cell, wherein the first voltage is lower than 1.1V; and
   an input/output circuit comprised in the DRAM, wherein the input/output circuit is electrically connected to the DRAM core cell, and the input/output circuit is supplied with a third voltage to make the input/output circuit operate at the third voltage, wherein the third voltage is lower than 1.1V;
   wherein the DRAM core cell and the input/output circuit are formed on a single chip, the input/output circuit is external to the DRAM core cell, and the first voltage is greater than the third voltage.

3. A dynamic random access memory (DRAM), comprising:
   a DRAM core cell comprised in the DRAM, wherein the DRAM core cell is supplied with a first voltage to make the DRAM core cell operate at the first voltage, and the DRAM core cell is a volatile memory cell; and
   an input/output circuit comprised in the DRAM, wherein the input/output circuit is electrically connected to the DRAM core cell, and the input/output circuit is supplied with a third voltage to make the input/output circuit operate at the third voltage, wherein the third voltage is lower than 1.1V;
   wherein the first voltage is greater than the third voltage, and the DRAM is capable to be applied to an embedded display port (eDP).

4. The dynamic random access memory of claim 3, wherein the first voltage is lower than 1.1V.

5. The dynamic random access memory of claim 3, further comprising:
   a peripheral circuit comprised in the DRAM, wherein the peripheral circuit is electrically connected to the DRAM core cell, and the peripheral circuit is supplied with a second voltage to make the peripheral circuit operate at the second voltage, wherein the second voltage is lower than 1.1V.

6. The dynamic random access memory of claim 5, wherein the first voltage is different from the second voltage.

* * * * *